US012622335B2

(12) United States Patent
Kirby

(10) Patent No.: US 12,622,335 B2
(45) Date of Patent: May 5, 2026

(54) EXOTHERMIC REACTIVE BONDING FOR SEMICONDUCTOR DIE ASSEMBLIES AND ASSOCIATED SYSTEMS AND METHODS

(71) Applicant: Micron Technology, Inc., Boise, ID (US)

(72) Inventor: Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 795 days.

(21) Appl. No.: 17/856,197

(22) Filed: Jul. 1, 2022

(65) Prior Publication Data

US 2023/0064032 A1      Mar. 2, 2023

Related U.S. Application Data

(60) Provisional application No. 63/238,330, filed on Aug. 30, 2021.

(51) Int. Cl.
| | |
|---|---|
| *H01L 23/00* | (2006.01) |
| *H01L 25/065* | (2023.01) |
| *H01L 25/18* | (2023.01) |

(52) U.S. Cl.
CPC .............. *H01L 24/80* (2013.01); *H01L 24/08* (2013.01); *H01L 24/05* (2013.01); *H01L 25/0657* (2013.01); *H01L 25/18* (2013.01); *H01L 2224/05647* (2013.01); *H01L 2224/08145* (2013.01); *H01L 2224/80365* (2013.01); *H01L 2224/80379* (2013.01); *H01L 2224/8085* (2013.01); *H01L 2224/80895* (2013.01); *H01L 2924/062* (2013.01); *H01L 2924/0665* (2013.01)

(58) Field of Classification Search
CPC ......... H01L 24/80; H01L 24/08; H01L 24/05; H01L 24/06; H01L 24/09; H01L 25/0657; H01L 24/83; H01L 25/50
See application file for complete search history.

(56) References Cited

U.S. PATENT DOCUMENTS

| | | | | |
|---|---|---|---|---|
| 9,362,143 B2 * | 6/2016 | Sun | ........................ | H01L 21/561 |
| 2004/0251524 A1 * | 12/2004 | Snyder | ................ | B81C 1/00269 |
| | | | | 257/E23.193 |
| 2021/0366820 A1 * | 11/2021 | Uzoh | .................. | H01L 23/5283 |

OTHER PUBLICATIONS

Product Information, Two-Part Epoxy Adhesive, Lord Engineered Adhesives (Year: 2004).*

* cited by examiner

*Primary Examiner* — Jacob Y Choi
(74) *Attorney, Agent, or Firm* — Dorsey & Whitney LLP

(57) ABSTRACT

Exothermic reactive bonding for semiconductor die assemblies, and associated systems and methods are disclosed. In an embodiment, a semiconductor die includes a dielectric layer having a conductive pad, where at least a portion of a surface of the dielectric layer includes a first epoxy compound. When another semiconductor die including a second epoxy compound (and another conductive pad) is brought in contact with the semiconductor die such that the first and second epoxy compounds can exothermically react, the thermal energy emanating from the exothermic reaction can facilitate bonding between the conductive pads to form interconnects between the two semiconductor dies. In some cases, the thermal energy is sufficient to form the interconnects. In other cases, the thermal energy assists the post bond annealing process to form the interconnects such that the annealing can be carried out at a lower temperature.

8 Claims, 7 Drawing Sheets

200A

200B

200C

400A

400B

EXOTHERMIC REACTIVE BONDING FOR SEMICONDUCTOR DIE ASSEMBLIES AND ASSOCIATED SYSTEMS AND METHODS

CROSS-REFERENCE TO RELATED APPLICATION(S)

The present application claims priority to U.S. Provisional Patent Application No. 63/238,330, filed Aug. 30, 2021, the disclosure of which is incorporated herein by reference in its entirety.

TECHNICAL FIELD

The present disclosure generally relates to semiconductor device assemblies, and more particularly relates to exothermic reactive bonding for semiconductor die assemblies and associated systems and methods.

BACKGROUND

Semiconductor packages typically include one or more semiconductor dies (e.g., memory chips, microprocessor chip, imager chip) mounted on a package substrate and encased in a protective covering. The semiconductor die may include functional features, such as memory cells, processor circuits, or imager devices, as well as bond pads electrically connected to the functional features. The bond pads can be electrically connected to corresponding conductive structures of the package substrate, which may be coupled to terminals outside the protective covering such that the semiconductor die can be connected to higher level circuitry.

In some semiconductor packages, two or more semiconductor dies are stacked on top of each other to reduce the footprint of the semiconductor packages. The semiconductor dies in the stack may be arranged in a pattern resembling stair-steps (which may be referred to as "shingle stacking") such that a portion of the semiconductor dies may be freely accessible—e.g., to attach bond wires to one or more bond pads located in the portion. In some cases, the semiconductor dies may be stacked in a "zig-zag" pattern to increase a space above the bond pads with respect to a semiconductor die overlying above the bond pads so as to facilitate forming the bond wires. Such arrangements, however, tend to increase overall heights of the semiconductor packages. Further, the bond wires may add to the heights and/or introduce delays in signal propagation.

BRIEF DESCRIPTION OF THE DRAWINGS

Many aspects of the present technology can be better understood with reference to the following drawings. The components in the drawings are not necessarily to scale. Instead, emphasis is placed on illustrating clearly the overall features and the principles of the present technology.

DETAILED DESCRIPTION

Figure 1:
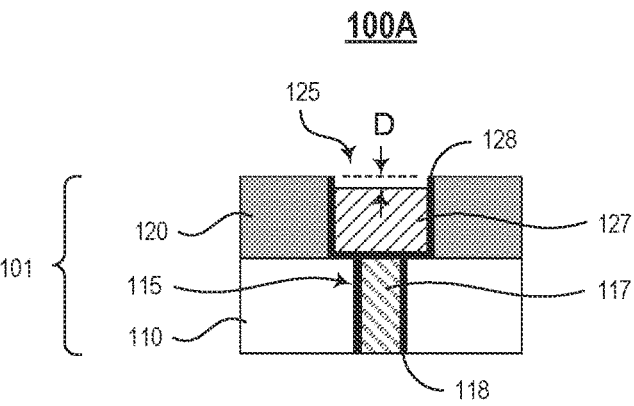
FIG. 1 illustrates various stages of process steps for direct bonding schemes.
Figure 1:
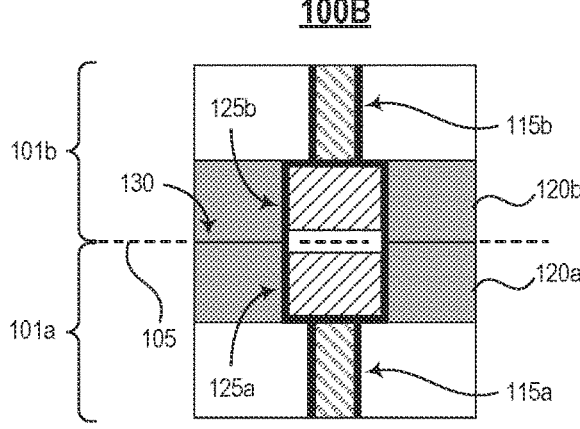
Figure 1:
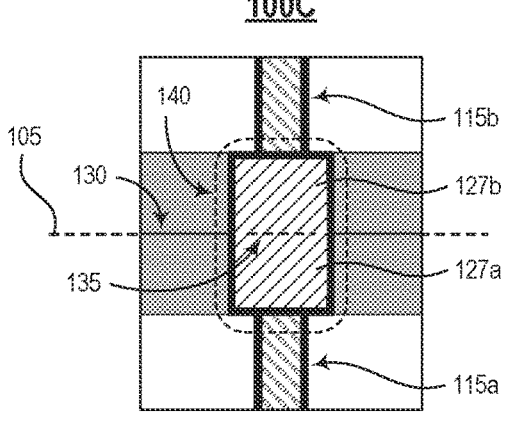

Specific details of several embodiments of exothermic reactive bonding for semiconductor die assemblies, and associated systems and methods are described below. The term "semiconductor device or die" generally refers to a solid-state device that includes one or more semiconductor materials. Examples of semiconductor devices (or dies) include logic devices or dies, memory devices or dies, controllers, or microprocessors (e.g., central processing unit (CPU), graphics processing unit (GPU)), among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished functional device. Depending upon the context in which it is used, the term "substrate" may include a semiconductor wafer, a package substrate, a semiconductor device or die, or the like. Suitable steps of the methods described herein can be performed with processing steps associated with fabricating semiconductor devices (wafer-level and/or die-level) and/or manufacturing semiconductor packages.

Various computing systems or environments, e.g., high-performance computing (HPC) systems, require high bandwidth and low power consumption. Certain schemes of forming interconnects between semiconductor dies (e.g., a direct bonding scheme) may facilitate satisfying the requirements, as well as providing form-factors suitable for scaling physical dimensions (e.g., heights) of semiconductor die assemblies of the HPC systems. The direct bonding scheme includes individual conductive components (e.g., copper pads, conductive pads, bond pads) of a first semiconductor die (or a first wafer including the first semiconductor die) aligned and directly bonded to corresponding one of conductive components of a second semiconductor die (or a second wafer including the second semiconductor die). Further, a dielectric material surrounding each of the conductive components of the first semiconductor die can be directly bonded to another dielectric material surrounding each of the conductive components of the second semiconductor die. In other words, the bonding interface includes two or more dissimilar materials of the first semiconductor die directly bonded to corresponding materials of the second semiconductor die (e.g., between dielectric materials, between conductive materials) to form interconnects and surrounding dielectric layers. As such, the direct bonding scheme may also be referred to a combination bonding scheme, a hybrid bonding scheme, or the like.

In some embodiments, the conductive materials include copper (or other suitable conductive materials or metals, such as tungsten) as a primary constituent, and the dielectric materials include silicon oxides (e.g., $SiO_2$), silicon nitrides (e.g., $Si_3N_4$), silicon carbon nitrides (e.g., SiCN), silicon carbonates (e.g., SiCO), or the like. During the direct bonding process, the dielectric materials of the first and second semiconductor dies (or the first and second wafers including the first and second semiconductor dies) are brought together such that the dielectric materials adhere to each other and hermetically seal the conductive components aligned to each other. Subsequently, the semiconductor dies are annealed at an elevated temperature (e.g., post bond annealing) such that the conductive materials of the conductive components can expand—e.g., swell vertically toward the bonding interface at least partially due to the differences in coefficients of thermal expansion (CTE) between the conductive materials and the dielectric materials. Eventually, the conductive materials are conjoined to form permanent bonding—e.g., metallurgical bonding. Additionally, the dielectric materials may enhance their bonding strength during the post bond annealing process.

In some embodiments, the post bond annealing temperature may reach approximately 400° C. or higher. As the semiconductor dies include fully processed devices (e.g., diodes, metal-oxide-semiconductor field-effect-transistors (MOSFETs)), when the annealing is done, the additional thermal budget during the annealing process may degrade electrical characteristics of the devices and/or performance of the circuits including the devices (e.g., integrated circuitry). Accordingly, eliminating the post bond annealing process steps or reducing the post bond annealing process temperature would be desirable to avoid risks to the semiconductor dies undergoing the direct bonding process steps.

The present technology mitigates risks associated with the thermal budget during the post bond annealing process by providing localized thermal energy proximate to the conductive components (e.g., copper pads) such that the conductive components form metallurgical bonding at a lower post bond annealing temperature (or without the post bond annealing process, in some cases). The localized thermal energy may be sufficiently far from the integrated circuitry so as to avoid or reduce adverse effects stemming from the thermal energy. The thermal energy may be obtained by exothermic reaction between epoxy compounds. Epoxy compounds may refer to a class of reactive prepolymers or polymers including epoxide groups. When proper epoxy compounds are brought together, cross-linking reactions (which may also be referred to as curing) would occur and the epoxy compounds may function as adhesives. Further, such reactions generate thermal energy (i.e., exothermic reactions) to raise temperature of surrounding areas.

As such, the thermal energy generated by the exothermic reactions can provide the thermal energy necessary for the conductive component to form the metallic bonding during the direct bonding process or at least supplement the thermal energy such that the post bond annealing temperature can be lowered during the direct bonding process. In this manner, adverse risks to the integrated circuitry can be mitigated. Further, the exothermic reactions can provide adhesion between epoxy compounds, which in turn bond the two semiconductor dies. In some embodiments, the adhesion between the epoxy compounds (as a result of the exothermic reaction) replaces the dielectric-to-dielectric bonding at the bonding interface. In other embodiments, the bonding between the epoxy compounds and the dielectric-to-dielectric bonding coexist at the bonding interface.

As used herein, the terms "front," "back," "vertical," "lateral," "down," "up," "top," "bottom," "upper," and "lower" can refer to relative directions or positions of features in the semiconductor device assemblies in view of the orientation shown in the Figures. For example, "upper"

or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIG. 1 illustrates various stages of process steps for direct bonding schemes. Diagram 100A illustrates a portion of a semiconductor die 101 with a substrate 110 having integrated circuitry (not shown) and a through-substrate via (TSV) 115 coupled with the integrated circuitry. In some embodiments, the TSV 115 includes a first conductive material 117 (e.g., tungsten) and a conductive barrier layer 118 (e.g., TiN). The semiconductor die 101 also includes a conductive pad 125 (which may also be referred to as a bond pad) formed in a dielectric layer 120 (e.g., silicon oxides, silicon nitrides, silicon carbon nitrides, silicon carbonates, or a combination thereof). The conductive pad 125 is electrically connected to the TSV 115 (and to the integrated circuitry through the TSV 115). In some embodiments, the conductive pad 125 includes a second conductive material 127 (e.g., copper) and another conductive barrier layer 128 (e.g., TaN).

The conductive pad 125 depicted in diagram 100A includes a surface recessed by a depth D with respect to the surface of the dielectric layer 120. In some embodiments, CMP process steps are used to form the conductive pad 125, and the recess may be a result of the CMP process. For example, the recess may be formed during over-polishing steps that remove excessive conductive material 127 on the surface of the dielectric layer 120. Additionally, or alternatively, the amount of recess (e.g., the recess depth D) may be targeted to ensure the surface of the conductive pad 125 not to protrude above the surface of the dielectric layer 120— e.g., to avoid such protruded conductive pads 125 interfering with the bonding process described with reference to diagram 100B. Further, the amount of recess may be targeted to be within a certain range such that the conductive materials 127 can form an interconnect 140 as described with reference to diagram 100C without compromising the bonding integrity.

Diagram 100B illustrates two semiconductor dies 101a and 101b (or two wafers including the semiconductor dies 101a and 101b) that are attached together such that dielectric materials of the top semiconductor die 101b and bottom semiconductor die 101a adhere to each other to form dielectric-to-dielectric bonding 130 at the bonding interface 105. In some embodiments, the dielectric surfaces are activated (e.g., using a plasma treatment process) to facilitate the bonding of the dielectric surfaces. Also, conductive pads (e.g., the top conductive pad 125b and the bottom conductive pad 125a) of the top and bottom semiconductor dies 101a and 101b are aligned to face each other but are not connected to each other due to the recessed surfaces of the conductive pads 125a/b.

Diagram 100C illustrates that the bonded dies/wafers are annealed in an elevated temperature (e.g., around 400° C.) such that the conductive materials of the top and bottom conductive pads 125a/b may expand toward each other in response to receiving thermal energy during the post bond annealing process (e.g., due to the mismatch in CTEs between the conductive materials and the dielectric materials) within an open space defined by the recess surfaces and the dielectric material surrounding the conductive pads 125a/b. When the surfaces of the top and bottom conductive materials are in contact, the conductive materials are conjoined (e.g., via atomic migration (intermixing, diffusion) from one conductive material to another conductive material) to form metal-to-metal bonding 135—e.g., metallurgical bonding, permanent bonding. Once the metallurgical bonding is formed between the conductive pads 125*a/b* (thus, forming the interconnect 140), the conductive materials do not separate (or sever) when the bonded dies/wafers are brought to the ambient temperature or operating temperatures of the semiconductor die assemblies. In this manner, the bonding interface 105 includes the dielectric-to-dielectric bonding 130 and the metal-to-metal bonding 135.

Figure 2A:
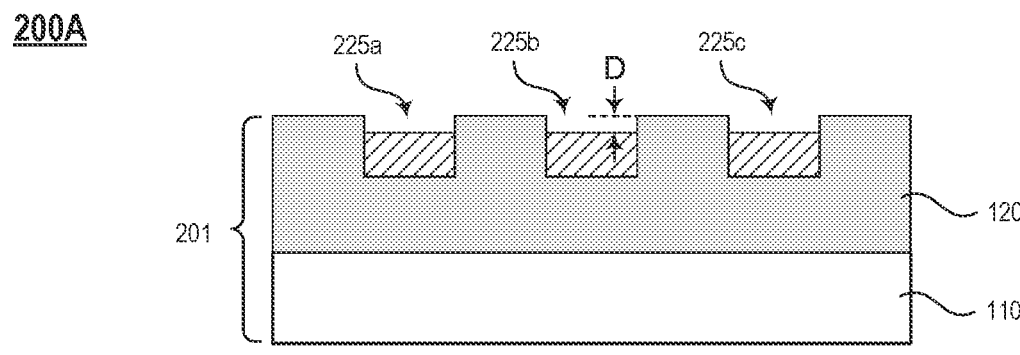
FIGS. 2A and 2B illustrate example schematic diagrams depicting various stages of forming semiconductor die assemblies in accordance with embodiments of the present technology.
Figure 2A:
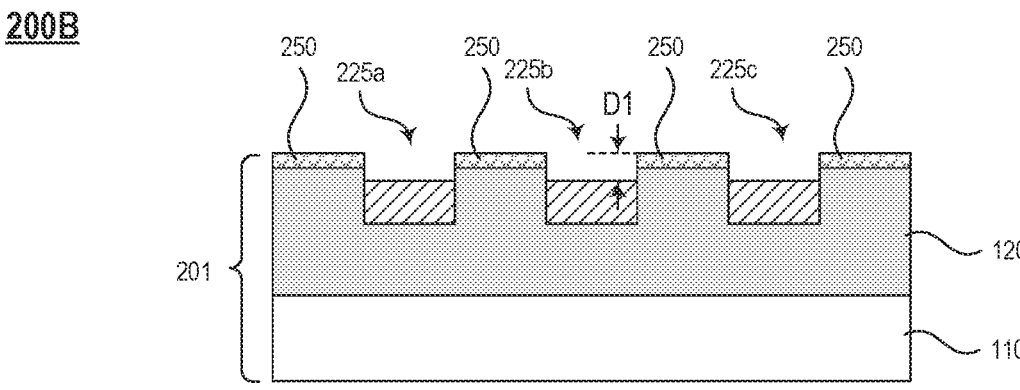
Figure 2A:
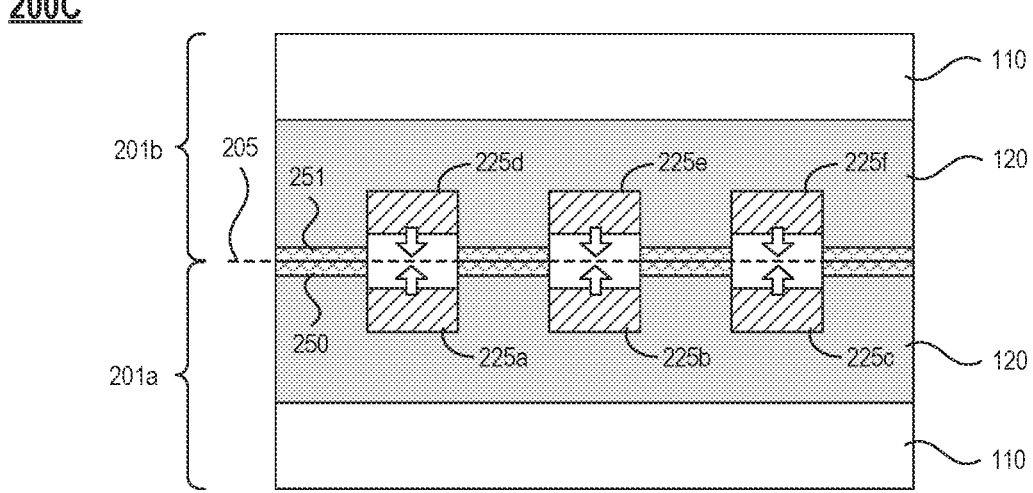
Figure 2B:
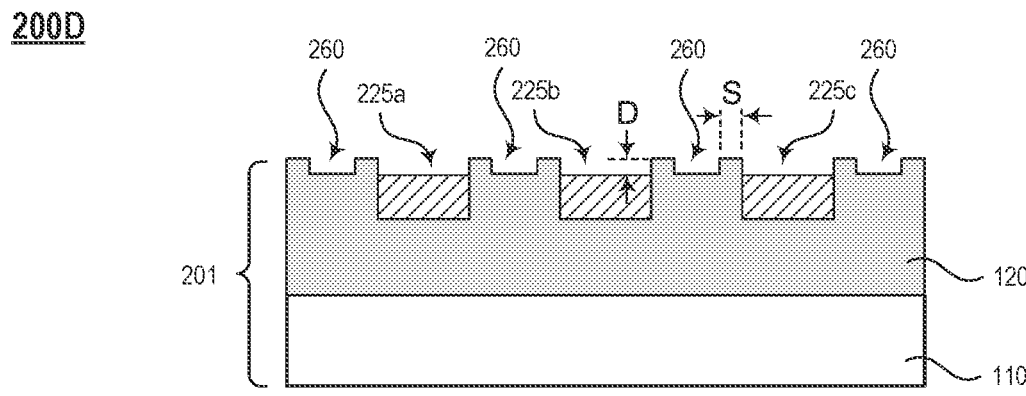
Figure 2B:
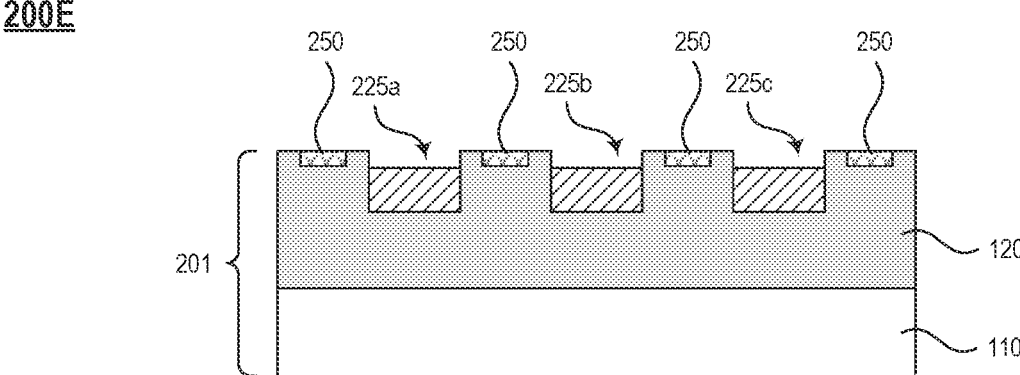
Figure 2B:
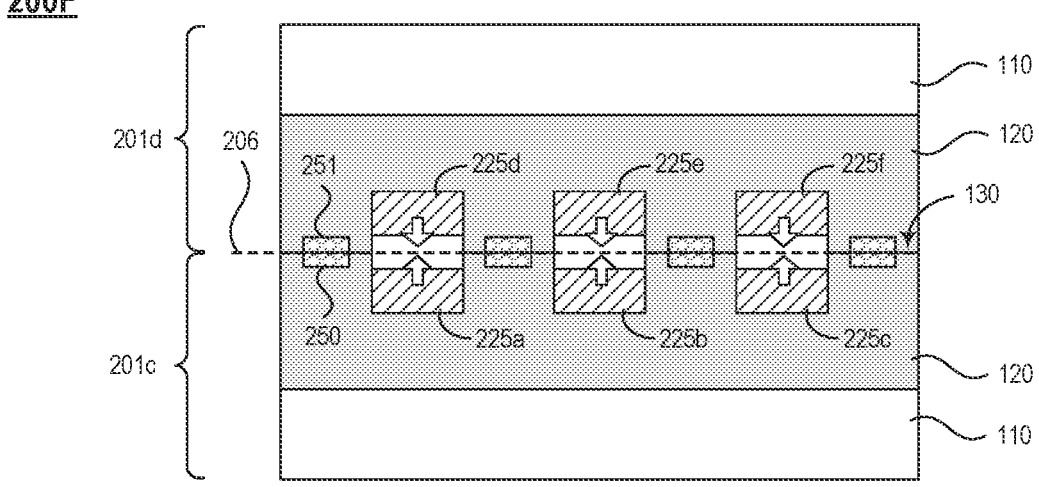

FIGS. 2A and 2B illustrate example schematic diagrams 200A through 200F depicting various stages of forming semiconductor die assemblies in accordance with embodiments of the present technology. Diagram 200A illustrates a portion of a semiconductor die 201, which may be an example of or include aspects of the semiconductor die 101 described with reference to FIG. 1. For example, the semiconductor die 201 includes the substrate 110 having integrated circuitry (not shown). The semiconductor die 201 also includes one or more conductive pads 225 (also identified individually as 225*a-c*) formed in the dielectric layer 120. The TSVs 115 coupling the conductive pads 225 to the integrated circuitry are omitted in diagram 200A. The conductive pads 225 have a surface recessed with respect to the surface of the dielectric layer 120 (denoted as D)—e.g., as a result of the CMP process described with reference to FIG. 1.

Diagram 200B illustrates that the top portion of the dielectric layer 120 includes a first epoxy compound 250. In some embodiments, the top portion of the dielectric layer 120 depicted in diagram 200A has been replaced with the first epoxy compound 250. For example, the dielectric layer 120 may have included a sacrificial layer at its top portion, which can be replaced with the first epoxy compound 250 at later process steps. In other embodiments, the first epoxy compound 250 may be deposited over the dielectric layer 120 and the conductive pads 225. Subsequently, the first epoxy compound 250 over the conductive pads 225 may have been selectively removed. For example, photolithography steps can be utilized to expose the first epoxy compound 250 over the conductive pads 225 such that an etch process (dry or wet) can remove the first epoxy compound 250 over the conductive pads 225. As a result of forming the first epoxy compound 250, the conductive pads 225 have a surface recessed with respect to the surface of the first epoxy compound 250 (denoted as D1, which may be different than D). So long as the surface of the conductive pads 225 is recessed with respect to the bonding interface 205 described with reference to diagram 200C, the conductive pads 225 would not interfere with the direct bonding process.

Diagram 200C illustrates that two semiconductor dies 210 (also identified individually as 210*a* and 210*b*) that are brought together to form a bonding interface 205 (a mating interface). As shown in diagram 200C, two semiconductor dies 210*a* and 210*b* face each other such that the conductive pads are aligned to each other. Further, the semiconductor dies 201*a* and 201*b* include a first epoxy compound 250 and a second epoxy compound 251, respectively, and the first epoxy compound 250 contacts the second epoxy compound 251 at the bonding interface 205. The first epoxy compound 250 can be configured (e.g., determined, selected) to exothermically react with the second epoxy compound 251 to provide thermal energy for the conductive materials of the conductive pads 225 to expand toward the bonding interface 205 (indicated by upward and downward arrows). In other words, the surfaces of the conductive pads 225 extend toward the surface of the dielectric layer 120 (and toward the bonding interface 205) in response to the exothermal reaction between the first and second epoxy compounds 250 and 251. In some embodiments, the first and second epoxy compounds includes at least one of polyepoxides, oxirane, bisphenol-based materials, novolaks materials, aliphatic materials, halogenated materials, or glycidylamine materials. In some embodiments, the first and second epoxy compounds 250 and 251 have thicknesses ranging between approximately 10 nm (e.g., 10±2 nm) to 2 or 3 micrometers (µm), respectively.

In some embodiments, the thermal energy generated by the exothermic reaction is sufficient to form metallic bonding between the top and bottom conductive pads 225 at the bonding interface 205—e.g., bond pads 225*a* and 225*d*, bond pads 225*b* and 225*e*, bond pads 225*c* and 225*f*. In some embodiments, the semiconductor dies 210*a* and 210*b* attached to each other may be annealed (e.g., in a furnace or an oven) at a temperature (e.g., 200° C.) to form the metallic bonding between the top and bottom conductive pads 225. The post bond annealing temperature (e.g., 200° C.) for the epoxy bonded semiconductor dies can be less than the post bond annealing temperature (e.g., 400° C.) for semiconductor dies bonded without the epoxy compounds to form the metallic bonding. In some embodiments, the semiconductor dies 201*a* and 201*b* are brought together in an oven or a furnace during the annealing process to form the interconnects 440 such that the exothermic reaction between the first and second epoxy compounds 250 and 251 occurs concurrently with the annealing process (e.g., at around 200° C. instead of 400° C.).

In alternative embodiments, as diagram 200D illustrates, certain portions of the dielectric layer 120 may be etched to form one or more recessed areas 260. The recessed areas 260 may be spaced apart from the conductive pads 225 by a space S. Footprints of the recessed areas 260 may resemble moats around the conductive pads 225 (e.g., as depicted in diagram 300C of FIG. 3). Alternatively, the recessed areas 260 may correspond to regularly spaced trenches formed in the dielectric layer 120 (e.g., as depicted in diagram 300E of FIG. 3). Further details of the recessed areas 260 are described with reference to FIG. 3.

Diagram 200E illustrates that the recessed areas 260 have been filled with the first epoxy compound 250. In some embodiments, the first epoxy compound 250 may be deposited on the surface of the dielectric layer 120 to fill the recessed areas 260. Subsequently, a CMP process may be utilized to remove the excess first epoxy compound 250 on the surface of the dielectric layer 120 while preserving the first epoxy compound 250 in the recessed areas 260. Thereafter, additional process steps including photolithography steps and etch steps may be utilized to selectively remove the first epoxy compound 250 from the recessed surface of the conductive pads 225.

Diagram 200F illustrates that two semiconductor dies 210 (also identified individually as 210*c* and 210*d*) that are brought together to form a bonding interface 206 (a mating interface). As shown in diagram 200F, two semiconductor dies 210*c* and 210*d* face each other such that the conductive pads 225 are aligned to each other. Further, the semiconductor dies 201*c* and 201*d* include a first epoxy compound 250 and a second epoxy compound 251, respectively, and the first epoxy compound 250 contacts the second epoxy compound 251 at the bonding interface 206. The first epoxy compound 250 can be configured (e.g., determined, selected) to exothermically react with the second epoxy compound 251 to provide thermal energy for the conductive materials of the conductive pads 225 to expand toward the bonding interface 206 (indicated by upward and downward arrows). In other words, the surfaces of the conductive pads 225 extend toward the surface of the dielectric layer 120 (and toward the bonding interface 206) in response to the exothermal reaction between the first and second epoxy compounds 250 and 251.

As described above, the thermal energy generated by the exothermic reaction can be sufficient to form metallic bonding between the top and bottom conductive pads 225 at the bonding interface 206—e.g., bond pads 225*a* and 225*d*, bond pads 225*b* and 225*e*, bond pads 225*c* and 225*f*. Alternatively, the semiconductor dies 210*c* and 210*d* attached to each other may be annealed (e.g., in a furnace or an oven) at a temperature (e.g., 200° C.) to form the metallic bonding between the top and bottom conductive pads 225. The post bond annealing temperature (e.g., 200° C.) for the epoxy bonded semiconductor dies can be less than the post bond annealing temperature (e.g., 400° C.) for semiconductor dies bonded without the epoxy compounds to form the metallic bonding. In some embodiments, the semiconductor dies 201*c* and 201*d* are brought together in an oven or a furnace during the annealing process to form the interconnects 440 such that the exothermic reaction between the first and second epoxy compounds 250 and 251 occurs concurrently with the annealing process (e.g., at around 200° C. instead of 400° C.).

Figure 3:
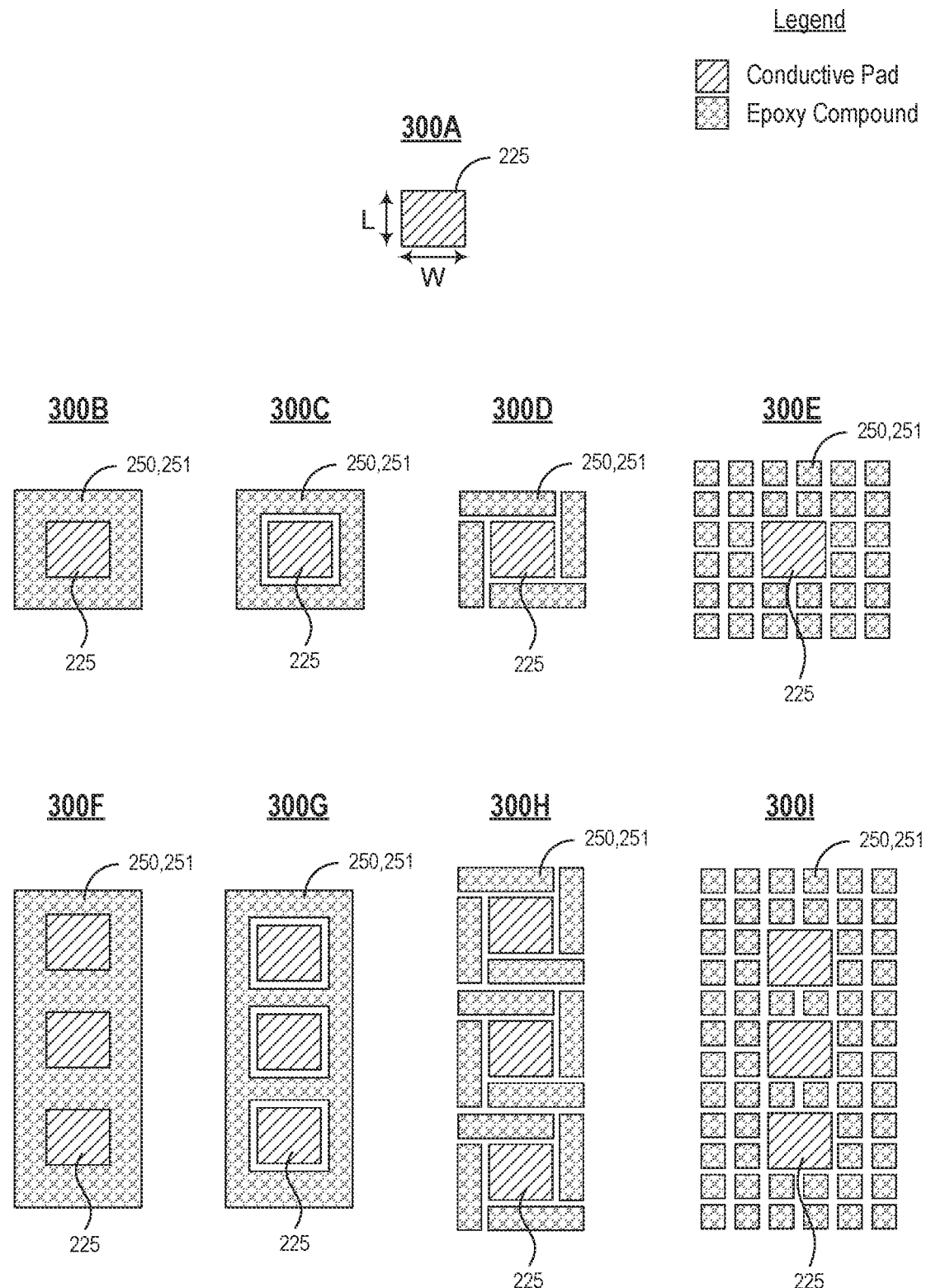
FIG. 3 illustrates top-down views of conductive pads of semiconductor dies in accordance with embodiments of the present technology.

FIG. 3 illustrates top-down views of conductive pads of semiconductor dies in accordance with embodiments of the present technology. Diagram 300A depicts a conductive pad 225 (a copper pad, a bond pad, a conductive component) having a width (W) and a length (L). In some embodiments, the width and length are comparable as depicted in diagram 300A. In some embodiments, the width (and/or length) can be less than 1 μm. The shape and dimensions of the conductive pad 225 described with reference to FIG. 3 are examples only and the present technology is not limited thereto. For example, conductive pads 225 may have footprints (layout) resembling circles, ellipses, race-tracks, rectangles with dissimilar widths and lengths, or any polygon shapes. Further, the conductive pad 225 can have widths greater than 1, 5, 10 μm, or even greater.

Diagrams 300B through 300E illustrate various arrangements of epoxy compounds surrounding the conductive pad 225. Diagram 300B may correspond to a top-down view of one of the conductive pads 225 depicted in diagram 200B. Diagrams 300C, 300D, and 300E may correspond to a top-down view of one of the conductive pads 225 depicted in diagram 200E, where the epoxy compound are spaced apart from the conductive pads 225. Diagram 300C illustrates that the recessed areas (e.g., recessed areas 260 filled with epoxy compounds 250, 251) surrounding the conductive pad 125 resembles a moat. Diagram 300D illustrates that the recessed areas surrounding the conductive pad 125 includes multiple strips or trenches filled with the epoxy compounds. Diagram 300E illustrates that the recessed areas surrounding the conductive pad 125 includes multiple patterns of squares or rectangles (which may be referred to as a sea of squares/rectangles) filled with the epoxy compounds, where one or more square/rectangle patterns at least partially overlap with the conductive pad 225 are removed—e.g., during the layout of the conductive pads 225.

In some embodiments, the entire surface of the semiconductor dies (e.g., the semiconductor die 201) unoccupied by the conductive pads 225 may be covered with the epoxy compounds. In such embodiments, the bonding interface (e.g., the bonding interface 205) includes the metallic bonding (e.g., the metal-to-metal bonding 135 forming the interconnect 140) and the bonding between the epoxy compounds (e.g., between the first epoxy compound 250 and the second epoxy compound 251).

In alternative embodiments, the epoxy compounds may cover one or more regions of the semiconductor dies where the conductive pads 225 are located. For example, some semiconductor dies (e.g., the semiconductor die 201) may include the conductive pads 225 located in certain regions (e.g., a central region, peripheral regions, one or more regions near edges) of the semiconductor dies—e.g., for compact layouts of the semiconductor dies, for efficient signal routing schemes. FIG. 3 includes diagrams 300F through 300I depicting such regions of the semiconductor dies (e.g., regions including three (3) conductive pads 225), which are covered by the epoxy compounds. In such embodiments, the bonding interface (e.g., the bonding interface 206) includes the metallic bonding (e.g., the metal-to-metal bonding 135 forming the interconnect 140), the bonding between the epoxy compounds (e.g., between the first epoxy compound 250 and the second epoxy compound 251), and the dielectric-to-dielectric bonding (e.g., the dielectric-to-dielectric bonding 130). Although diagrams 300E-300I illustrate three (3) conductive pads 225 in such regions as examples, the present technology is not limited thereto. For example, the region where the conductive pads are located may include several tens of conductive pads, several hundreds of conductive pads, or even more.

Figure 4:
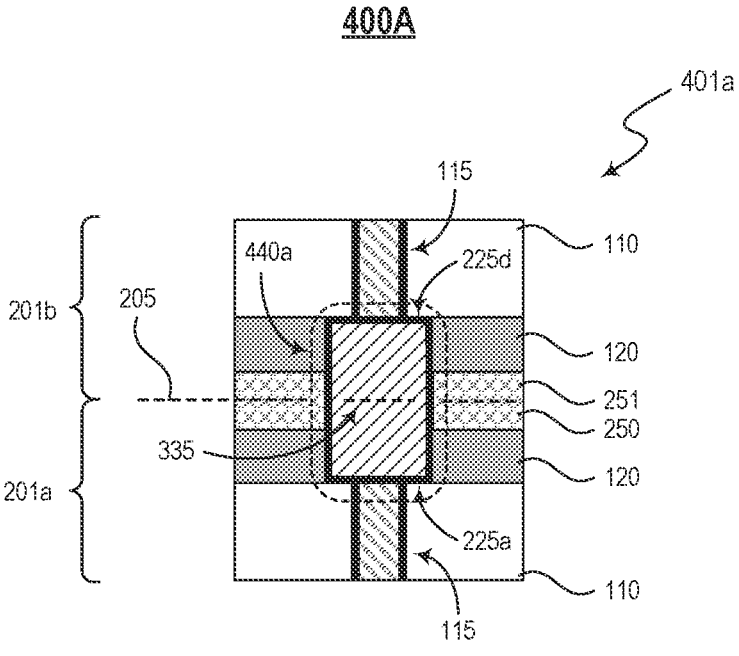
FIG. 4 illustrates cross-sectional diagrams of interconnects of semiconductor die assemblies including directly bonded conductive pads in accordance with embodiments of the present technology.
Figure 4:
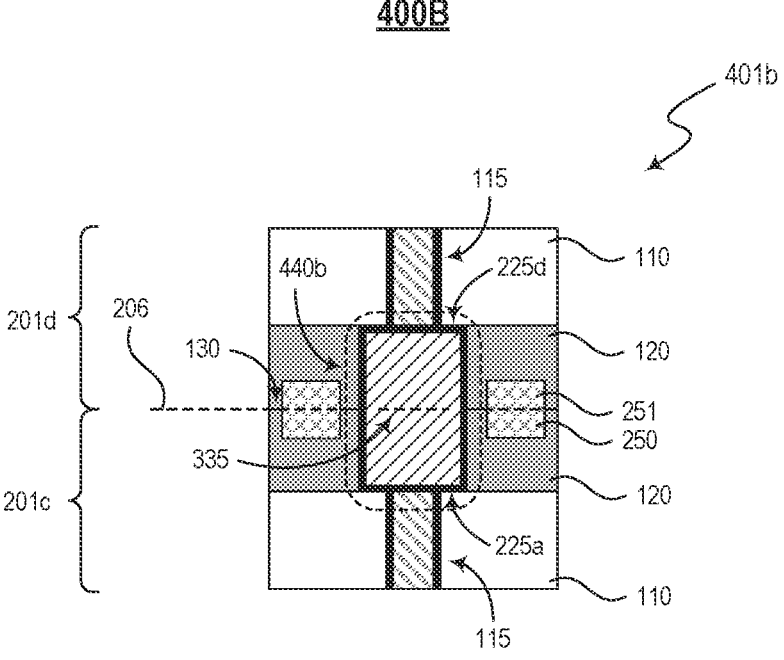

FIG. 4 illustrates cross-sectional diagrams of interconnects of semiconductor die assemblies including directly bonded conductive pads in accordance with embodiments of the present technology. Diagram 400A depicts a portion of a semiconductor assembly 401*a* including two semiconductor dies—e.g., semiconductor dies 201*a* and 201*b* described with reference to diagram 200C of FIG. 2A. Diagram 400A depicts one of multiple interconnects 440 (e.g., interconnect 440*a*) formed by bonding (conjoining) the conductive pads 225 of the semiconductor dies 201*a/b*—e.g., the conductive pads 225*a* and 225*d* coupled to TSVs 115, respectively. The TSVs 115 are coupled with integrated circuitry (not shown) of the semiconductor dies 201*a* and 201*b*, respectively. Diagram 400A also depicts the first and second epoxy compounds 250 and 251 bonded at the bonding interface 205 as a result of an exothermic reaction between the first and second epoxy compound 250 and 251. In this regard, diagram 400A represents the conductive pads 125*a* and 125*d* depicted in diagram 200C of FIG. 2A after the conductive pads 125*a* and 125*d* have been bonded to each other.

As described herein, the exothermic reaction between the first and second epoxy compound 250 and 251 may provide adequate thermal energy to the conductive pads 125*a* and 125*d* such that the conductive pads 125*a* and 125*d* can expand toward the bonding interface 205 to form the interconnect 440*a* in response to the exothermic reaction—e.g., without the post bond annealing process. Alternatively, the exothermic reaction may supplement the thermal energy required for the conductive pads 125*a* and 125*d* to form the interconnect 440*a* such that the post bond annealing process can be carried out at a lower temperature (e.g., around 200° C. instead of 400° C.). In some embodiments, the semiconductor dies 201*a* and 201*b* may be brought together in an oven or a furnace during the annealing process such that the exothermic reaction between the first and second epoxy compounds 250 and 251 occurs concurrently with the annealing process (e.g., at around 200° C.). The bonding interface 205 includes the metallic bonding between the conductive pads 125a and 125d (e.g., forming the interconnect 440a) and the bonding between the epoxy compounds (e.g., between the first epoxy compound 250 and the second epoxy compound 251).

Diagram 400B depicts a portion of a semiconductor assembly 401b including two semiconductor dies—e.g., semiconductor dies 201c and 201d described with reference to diagram 200F of FIG. 2B. Diagram 400B depicts one of multiple interconnects 440 (e.g., interconnect 440b) formed by bonding (conjoining) the conductive pads 225 of the semiconductor dies 201c/d—e.g., the conductive pads 225a and 225d coupled to TSVs, respectively. The TSVs 115 are coupled with integrated circuitry (not shown) of the semiconductor dies 201c and 201d, respectively. Diagram 400B also depicts the first and second epoxy compound 250 and 251 bonded at the bonding interface 206 as a result of an exothermic reaction between the first and second epoxy compound 250 and 251. In this regard, diagram 400B represents the conductive pads 225a and 225d depicted in diagram 200F of FIG. 2B after the conductive pads 225a and 225d have been bonded to each other—e.g., through the CTE mismatch expansion facilitated by the exothermic reaction or the exothermic reaction occurring concurrently with the annealing process. The bonding interface 206 includes the metallic bonding between the conductive pads 225a and 225d (e.g., forming the interconnect 440b), the bonding between the epoxy compounds (e.g., between the first epoxy compound 250 and the second epoxy compound 251), and the dielectric-to-dielectric bonding (e.g., the dielectric-to-dielectric bonding 130 between the dielectric layers 120 of the semiconductor dies 201c and 201d).

Figure 5:
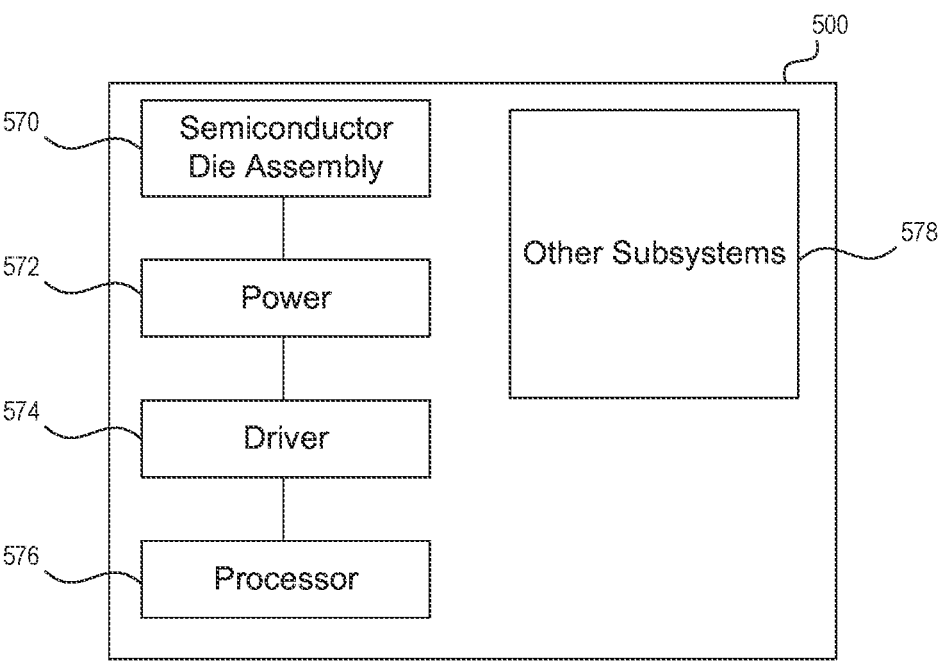
FIG. 5 is a block diagram schematically illustrating a system including a semiconductor die assembly in accordance with embodiments of the present technology.

FIG. 5 is a block diagram schematically illustrating a system 500 including a semiconductor die assembly in accordance with embodiments of the present technology. The system 500 can include a semiconductor device assembly 570, a power source 572, a driver 574, a processor 576, and/or other subsystems or components 578. The semiconductor device assembly 570 can be incorporated into any of a myriad of larger and/or more complex systems, a representative example of which is the system 500 shown schematically in FIG. 5. The semiconductor die assembly described with reference to FIG. 4 may be included in the semiconductor device assembly 570 of the system 500.

The semiconductor device assembly 570 can have features generally similar to the semiconductor die assembly described herein with reference to FIG. 4. For example, the semiconductor device assembly 570 may include two semiconductor dies (e.g., a first semiconductor die and a second semiconductor die) that are directly bonded to each other. In some embodiments, a first semiconductor die includes a first semiconductor substrate, a first dielectric layer over the first semiconductor substrate, where at least a portion of a first surface of the first dielectric layer opposite the first semiconductor substrate includes a first epoxy compound, and a first copper pad in the first dielectric layer, the first copper pad surrounded by the first epoxy compound. Further, the second semiconductor die includes a second semiconductor substrate, a second dielectric layer over the second semiconductor substrate, where at least a portion of a second surface of the second dielectric layer opposite the second semiconductor substrate includes a second epoxy compound, and a second copper pad in the second dielectric layer, the second copper pad surrounded by the second epoxy compound. The first and second semiconductor dies are arranged to have the first surface contacting the second surface to form a bonding interface, and the first and second epoxy compounds are bonded to each other in response to an exothermic reaction between the first and second epoxy compounds.

In some embodiments, the first and second copper pads are aligned and directly bonded to each other based, at least in part, on thermal expansion of the first and second copper pads to conjoin at the bonding interface in response to the exothermic reaction between the first and second epoxy compounds. In some embodiments, the first and second copper pads are directly bonded to each other at a first temperature less than a second temperature necessary for the thermal expansion of the first and second copper pads absent the exothermic reaction between the first and second epoxy compounds.

In some embodiments, the first copper pad belongs to a plurality of first copper pads in the first dielectric layer, the first epoxy compound covers the first surface of the first dielectric layer unoccupied by the plurality of first copper pads, the second copper pad belongs to a plurality of second copper pads in the second dielectric layer, the second epoxy compound covers the second surface of the second dielectric layer unoccupied by the plurality of second copper pads, and the bonding interface includes the first and second epoxy compounds bonded to each other and a plurality of interconnects, where each interconnect includes an individual first copper pad bonded to a corresponding second copper pad.

In some embodiments, the first copper pad belongs to a plurality of first copper pads in the first dielectric layer, the plurality of first copper pads located in a first region of the first surface, the first epoxy compound covers the first region unoccupied by the plurality of first copper pads, the second copper pad belongs to a plurality of second copper pads in the second dielectric layer, the plurality of second copper pads located in a second region of the second surface, the second epoxy compound covers the second region unoccupied by the plurality of second copper pads, and the bonding interface includes the first and second epoxy compounds bonded to each other, parts of the first and second dielectric layer directly bonded to each other, and a plurality of interconnects, where each interconnect includes an individual first copper pad bonded to a corresponding second copper pad.

In some embodiments, the facing first and second copper pads can be similarly sized and shaped (as shown in the appended Figures). In other embodiments, the facing first and second copper pads can be different sizes (i.e., one larger than the other) and/or different shapes.

The resulting system 570 can perform any of a wide variety of functions, such as memory storage, data processing, and/or other suitable functions. Accordingly, representative systems 570 can include, without limitation, handheld devices (e.g., mobile phones, tablets, digital readers, and digital audio players), computers, and appliances. Components of the system 570 may be housed in a single unit or distributed over multiple, interconnected units (e.g., through a communications network). The components of the system 570 can also include remote devices and any of a wide variety of computer readable media.

Figure 6:
FIG. 6 is a flowchart of a method of forming semiconductor die assemblies in accordance with embodiments of the present technology.
Figure 6:
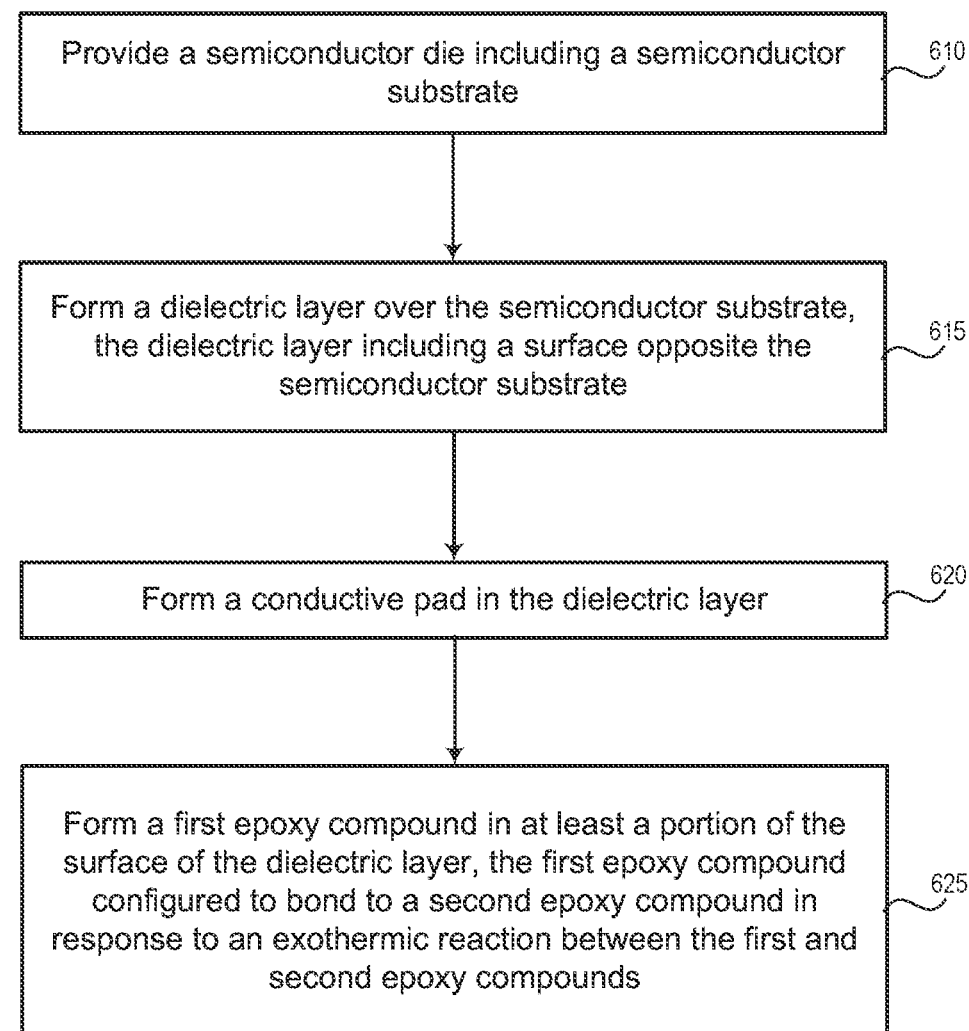

FIG. 6 is a flowchart of a method of forming semiconductor die assemblies in accordance with embodiments of the present technology. The flowchart 600 may include aspects of methods as described with reference to FIGS. 1 through 4.

The method comprises providing a semiconductor die including a semiconductor substrate (box 610). The method further comprises forming a dielectric layer over the semiconductor substrate, the dielectric layer including a surface opposite the semiconductor substrate (box 615). The method further comprises forming a conductive pad in the dielectric layer (box 620). The method further comprises forming a first epoxy compound in at least a portion of the surface of the dielectric layer, the first epoxy compound configured to bond to a second epoxy compound in response to an exothermic reaction between the first and second epoxy compounds (box 625).

In some embodiments, forming the first epoxy compound in at least the portion of the surface of the dielectric layer includes depositing the first epoxy compound over the dielectric layer and the conductive pad, and selectively removing the first epoxy compound over the conductive pad. In some embodiments, forming the first epoxy compound in at least the portion of the surface of the dielectric layer includes forming a recessed area in the dielectric layer, depositing the first epoxy compound in the recessed area and over the dielectric layer and the conductive pad, and selectively removing the first epoxy compound over the dielectric layer and the conductive pad.

In some embodiments, the semiconductor die is a first semiconductor die, the semiconductor substrate is a first semiconductor substrate, the dielectric layer is a first dielectric layer, the surface is a first surface, and the conductive pad is a first conductive pad, and the method further comprises providing a second semiconductor die including a second semiconductor substrate, a second dielectric layer over the second semiconductor substrate, wherein at least a portion of a second surface of the second dielectric layer opposite the second semiconductor substrate includes the second epoxy compound, and a second conductive pad in the second dielectric layer, the second conductive pad surrounded by the second epoxy compound.

In some embodiments, the method further comprises arranging the first and second semiconductor dies such that the first and second surfaces face each other, aligning the first and second conductive pads, and attaching the first surface to the second surface to form a bonding interface between the first and second semiconductor dies. In some embodiments, the method further comprises heating the first and second semiconductor dies attached to each other to a first temperature to directly bond the first and second conductive pads to each other based, at least in part, on thermal expansion of the first and second conductive pads to conjoin at the bonding interface in response to the exothermic reaction between the first and second epoxy compounds, wherein the first temperature is less than a second temperature necessary for the thermal expansion of the first and second conductive pads absent the exothermic reaction.

It should be noted that the methods described above describe possible implementations, and that the operations and the steps may be rearranged or otherwise modified and that other implementations are possible. Furthermore, embodiments from two or more of the methods may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." The term "exemplary" used herein means "serving as an example, instance, or illustration," and not "preferred" or "advantageous over other examples."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die, comprising:

a semiconductor substrate including integrated circuitry;

a dielectric layer over the semiconductor substrate, wherein at least a portion of an upper surface of the dielectric layer opposite the semiconductor substrate includes a recessed moat filled with a first epoxy compound configured to exothermically react with a second epoxy compound, the first epoxy compound having an upper surface coplanar with the upper surface of the dielectric layer; and a conductive pad in the dielectric layer laterally surrounded by moat filled with the first epoxy compound, the conductive pad including a top surface recessed with respect to the upper surface of the dielectric layer, wherein the conductive pad is coupled with the integrated circuitry at a bottom surface of the conductive pad opposite the top surface.

2. The semiconductor die of claim 1, wherein the first and second epoxy compounds are configured to bond to each other in response to the first epoxy compound exothermically reacting with the second epoxy compound.

3. The semiconductor die of claim 1, wherein the first and second epoxy compounds are configured to cause the top surface of the conductive pad to extend toward the upper surface of the dielectric layer based on thermal expansion of the conductive pad in response to the first epoxy compound exothermically reacting with the second epoxy compound.

4. The semiconductor die of claim 1, wherein the first epoxy compound surrounds the conductive pad.

5. The semiconductor die of claim 1, wherein:

the conductive pad belongs to a plurality of conductive pads in the dielectric layer; and each conductive pad of the plurality is laterally surrounded by a corresponding moat filled with the first epoxy compound.

6. The semiconductor die of claim 1, wherein the first and second epoxy compounds includes at least one of polyepoxides, oxirane, bisphenol-based materials, novolaks materials, aliphatic materials, halogenated materials, or glycidylamine materials.

7. The semiconductor die of claim 1, wherein the first epoxy compound has a thickness ranging between 10 nm to 2 µm.

8. The semiconductor die of claim 1, wherein the conductive pad has a width less than 1 µm.

* * * * *